United States Patent [19]

Williams et al.

[11] 4,291,867
[45] Sep. 29, 1981

[54] AUTOMATIC INSERTION UNIVERSAL WORK HOLDING SYSTEM

[75] Inventors: Ernest E. Williams, Fullerton; William M. Brennan, Chino, both of Calif.

[73] Assignee: Rockwell International Corporation, El Segundo, Calif.

[21] Appl. No.: 51,774

[22] Filed: Jun. 25, 1979

[51] Int. Cl.³ .............................. B25B 1/24
[52] U.S. Cl. ..................... 269/43; 269/111; 269/296; 269/307; 269/903; 29/721; 29/760; 29/281.5
[58] Field of Search ............... 269/321 WE, 296–302, 269/307, 111, 903, 125, 37, 43; 29/739, 790, 791, 759, 760, 721, 281.5; 228/47, 44.1 A

[56] References Cited

U.S. PATENT DOCUMENTS

| | | | |
|---|---|---|---|
| 3,392,972 | 7/1968 | Wing | 269/111 X |
| 3,395,439 | 8/1968 | Palesi et al. | 269/321 WE X |
| 4,030,717 | 6/1977 | Serlovsky | 269/321 WE X |
| 4,121,816 | 10/1978 | Eads | 269/296 |

*Primary Examiner*—Robert C. Watson
*Attorney, Agent, or Firm*—H. Fredrick Hamann; Wilfred G. Caldwell

[57] ABSTRACT

The invention is a work holding system for adjustably receiving and holding printed circuit boards for automatic machine component insertion. It includes a frame and a plurality of mutually cooperative adjustable board holders. The frame is U-shaped and is made up of framing members each having a linear scale affixed thereto. An adjustably positionable framing member extends across the U and is slidable along the opposed framing members toward and away from the base framing member forming the bottom of the U. Means are provided for indexing, locking the adjustably positionable member to the frame in any desired position. A linear scale is also carried by the adjustably positionable member and all scales have a common datum. The frame carries indexing means to index it to the machine which inserts components. A number of adjustable board holders are slidably carried by the base framing member and the adjustably positionable framing member to receive circuit boards therebetween. The board holders are indexed and locked to the respective framing members in the proper positions for attaching the boards to the frame, and indexing means are carried by at least one of the receiving board holders for indexing the boards to the frame and consequently to the machine for component insertion. Another embodiment of the invention includes a second pair of adjustably positionable framing members slidable along the opposed framing members between the first adjustably positionable framing member and the mouth of the frame. This pair is equipped with similar structure, as previously described, in order that second or further circuit boards may be indexably received and supported between the further pair of adjustably positionable framing members. The plurality of adjustable board holders is universal in ability to receive and index any type of circuit board. Also, the provision of the second pair of adjustably positionable framing members permits 90° orientation of circuit boards from one side of the frame to the other side of the frame for insertion of components at 90° to those inserted at the first location.

26 Claims, 41 Drawing Figures

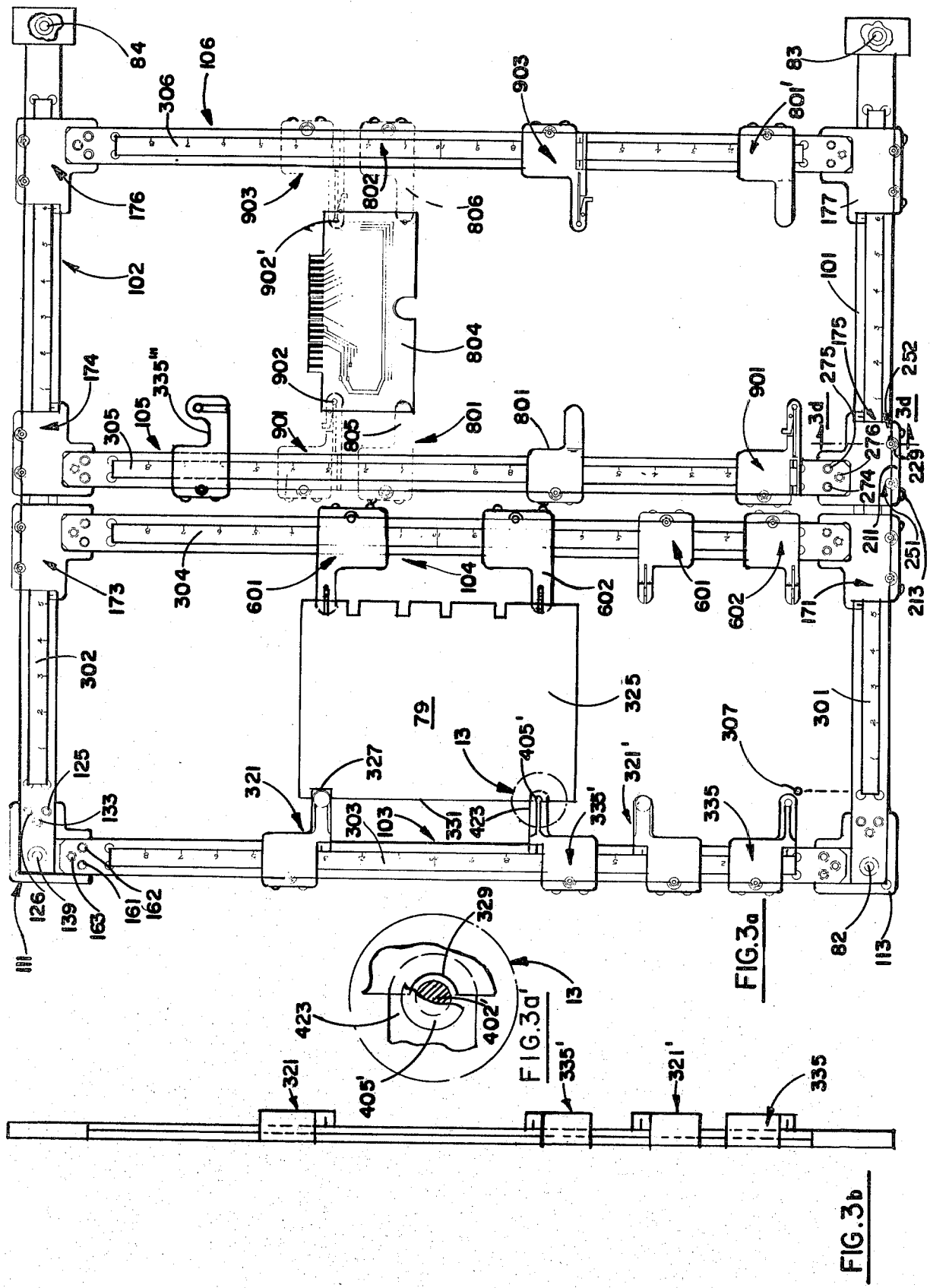

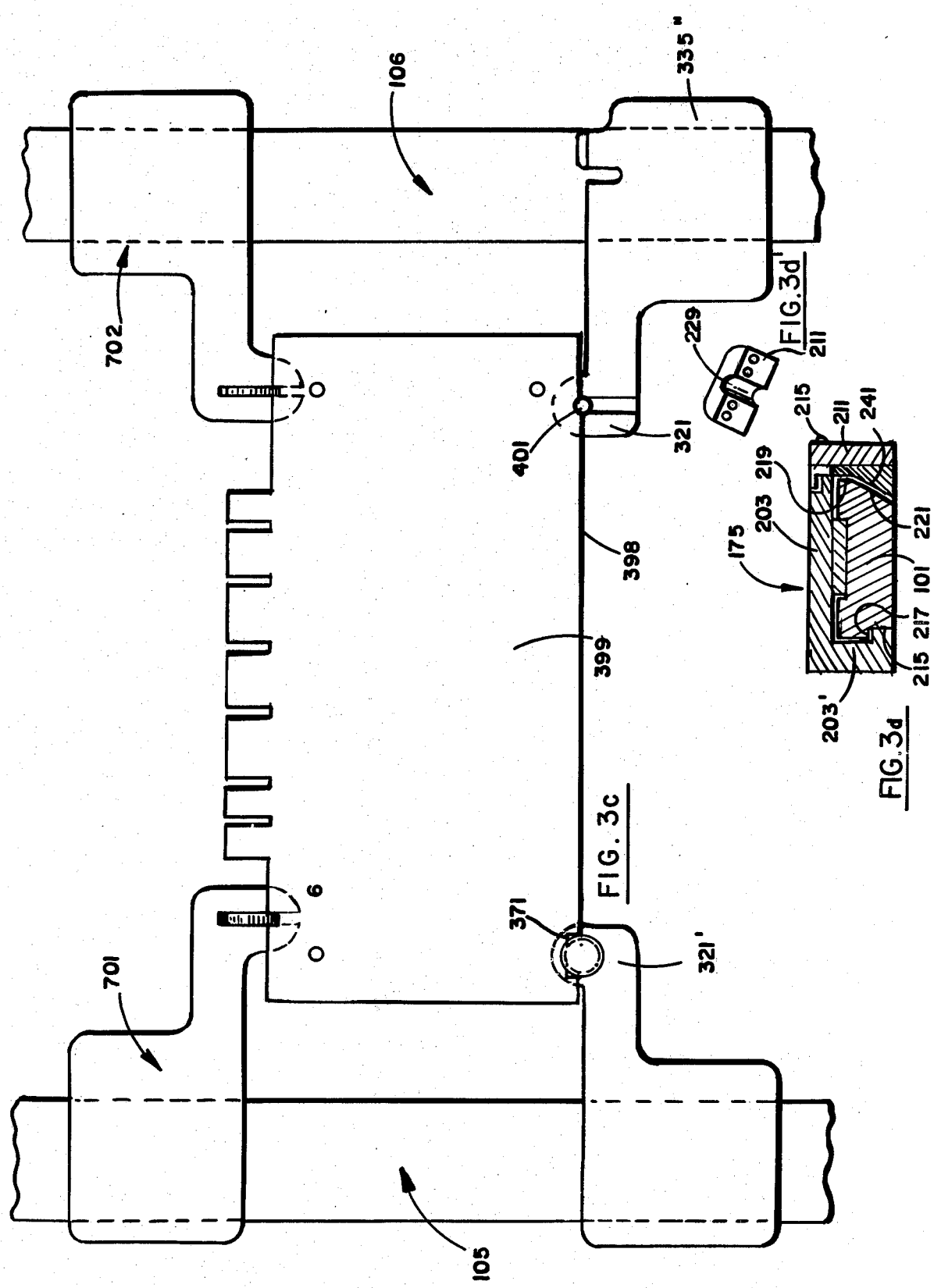

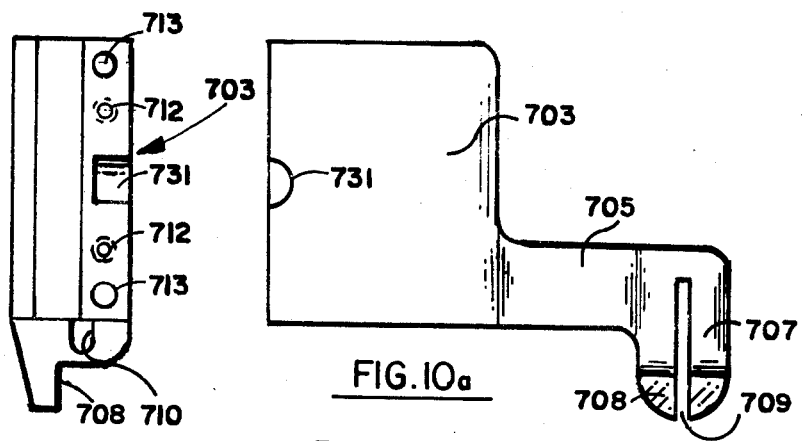
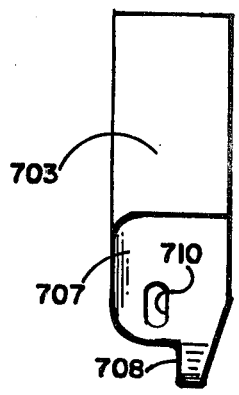
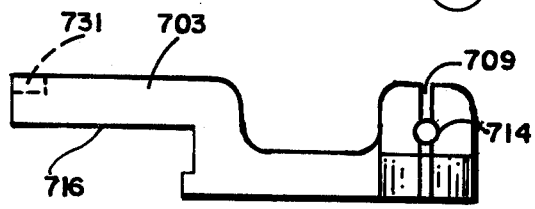
FIG. 10d
FIG. 10a
FIG. 10b
FIG. 10c
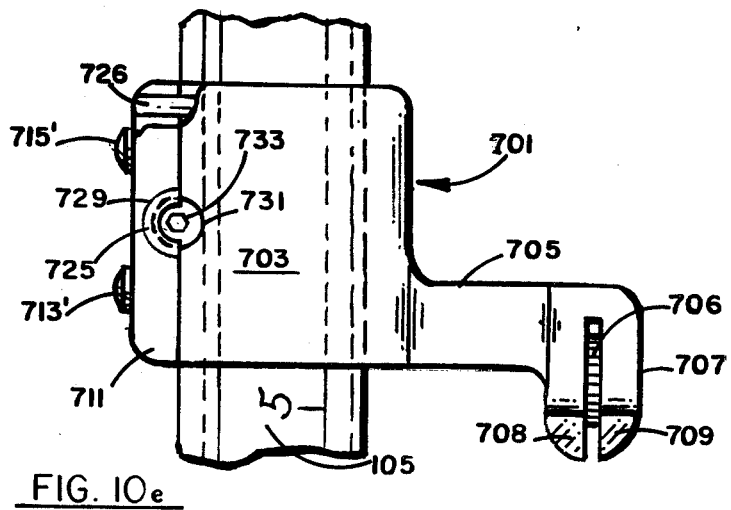
FIG. 10e
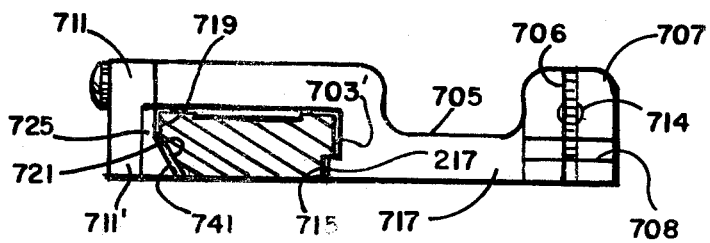
FIG. 10f

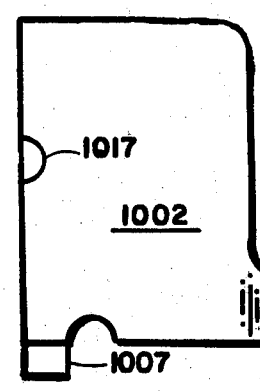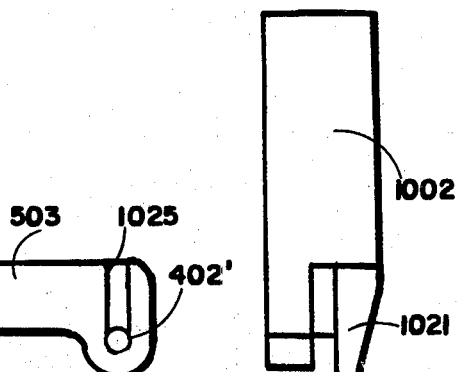
FIG. 11b     FIG. 11a     FIG. 11c
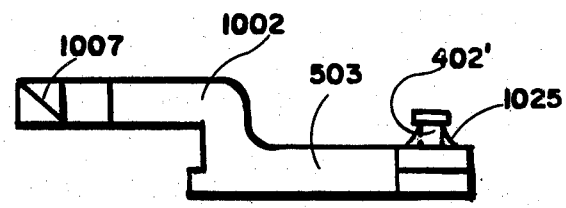
FIG. 11d
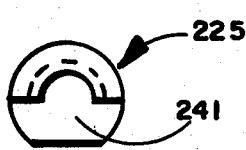     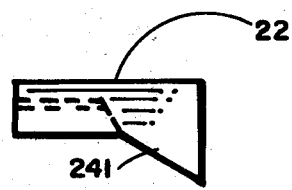
FIG. 16a     FIG. 16b
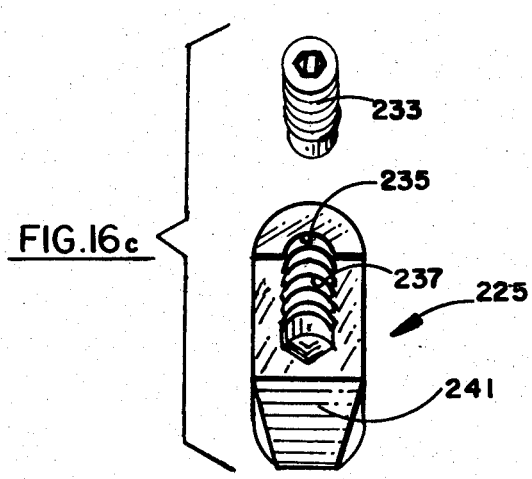
FIG. 16c

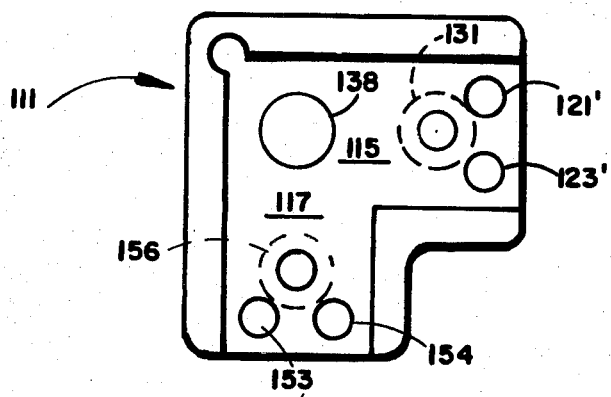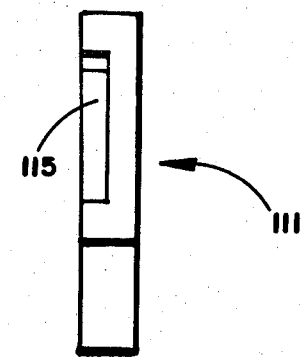
FIG. 12a    FIG. 12b
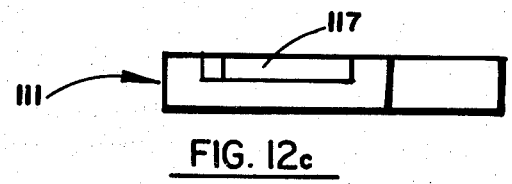
FIG. 12c
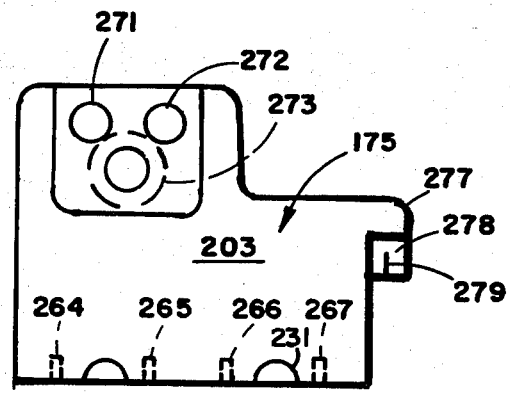
FIG. 13a
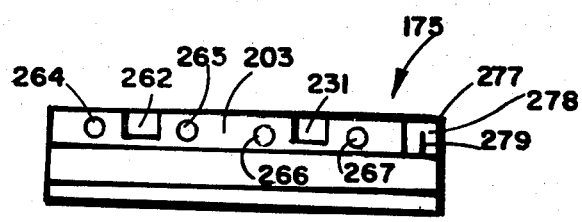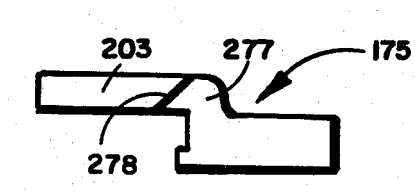
FIG. 13c    FIG. 13b

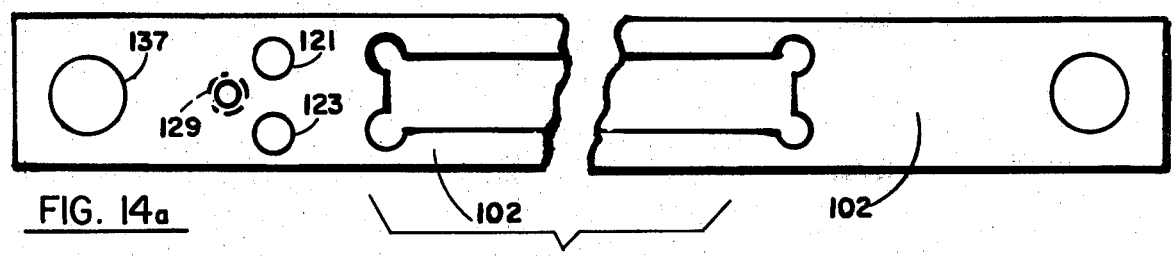
FIG. 14a
FIG. 14b
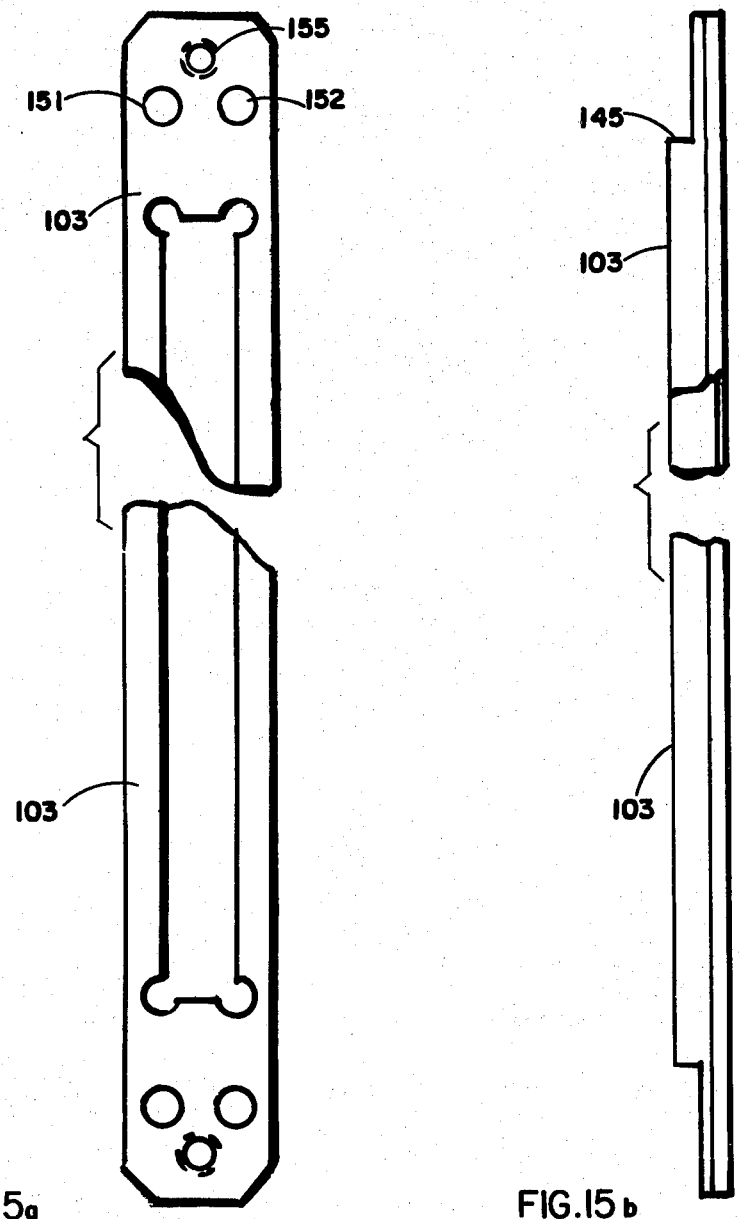
FIG. 15a
FIG. 15b 4,291,867

AUTOMATIC INSERTION UNIVERSAL WORK HOLDING SYSTEM

BACKGROUND OF THE INVENTION

1. Field of the Invention

The invention comprises an automatic insertion work holding system, and more particularly, such a system capable of universal functions in the receiving of different sized circuit boards, the accommodating of differently indexed circuit boards, and the provision for handling circuit boards at different orientations, i.e. 90° rotation for inserting components in both rows and columns of the boards.

2. Prior Art

The closest known prior art consists of tooling plates for each board type having windows that must be matched to the circuit boards and indexed accordingly. They are therefore not universal in any respect. In addition they do not provide the dual facility of applicants' invention in that there is no accessibility for load-unload during actual operation but they must go to off-load positions to reload the tooling plate. Further, no universal indexing, size accommodation or 90° orientation is available from the prior art.

SUMMARY OF THE INVENTION

The invention is a work holding system for adjustably holding printed circuit boards for automatic machine component insertion including a frame and a plurality of mutually cooperative adjustable board holders. The frame is U-shaped and is made up of framing members each having a linear scale affixed thereto. An adjustably positionable framing member extends across the U and is slidable along the opposed framing members toward and away from the base framing member forming the bottom of the U. Means are provided for locking the adjustably positionable member to the frame in any desired indexed position. A linear scale is also carried by the adjustably positionable member and all scales have a common datum. The frame carries indexing means to index it to the machine which inserts components. A number of adjustable board holders are slidably carried by the base framing member and the adjustably positionable framing member to receive circuit boards therebetween. The board holders are locked to the respective framing members in the proper positions for receiving and attaching the boards to the frame, and indexing means are carried by at least one of the receiving board holders for indexing the boards to the frame and consequently to the machine for component insertion. Another embodiment of the invention includes a second pair of adjustably positionable framing members slidable along the opposed framing members between the first adjustably positionable framing member and the mouth of the frame. This pair is equipped with the similar structure, as previously described, in order that second or further circuit boards may be indexably received and supported between the further pair of adjustably positionable framing members. The plurality of adjustable board holders is universal in ability to receive and index any type of circuit board. Also, the provision of the second pair of adjustably positionable framing members permits 90° orientation of circuit boards from one side of the frame to the other side of the frame for insertion of components at 90° to those inserted at the first location.

BRIEF DESCRIPTION OF THE DRAWINGS

The following detailed description will be better understood when taken in conjunction with the accompanying drawings wherein:

FIG. 3a is a view in plan of the preferred embodiment of the present invention.

FIG. 3a' is a detailed enlarged view of a portion of FIG. 3a;

FIG. 3b is a view in side elevation of the structure of FIG. 3a;

FIG. 3c is a view in plan of selected board holders indexing and gripping a circuit board;

FIG. 3d is a view in section of the frame and locking slide.

FIG. 3d' is an enlarged drawing of a portion of the structure of FIG. 3d;

FIG. 4b is a view in elevation of the structure of FIG. 4a;

FIG. 5b is a view in elevation of the structure of FIG. 5a;

FIG. 6b is a sectional view through the structure of FIG. 6a;

FIG. 7b is a view in elevation of the structure of FIG. 7a;

FIG. 8a' is an enlarged drawing of a portion of FIG. 8a;

FIG. 8b is a view in elevation through the structure of FIG. 8a;

FIG. 9b is a view in elevation of the structure in FIG. 9a;

FIGS. 10a through 10d are views of major components for assembly to comprise the assembled offset hold-down releasable pressure type board holder of FIGS. 10e and 10f;

FIG. 10a shows a view in plan of a major portion of the body of the holder;

FIG. 10b shows a right-hand elevational view of the FIG. 10a portion of the holder;

FIG. 10c is a front view of the structure of FIG. 10a;

FIG. 10d is an end view of the structure of FIG. 10a from the left side thereof;

FIG. 10e is an assembled view of the offset type hold-down releasable pressure board holder, otherwise corresponding to the regular or non-offset type holder of FIGS. 6a and 6b, in gripping engagement with a framing member;

FIG. 10f is a view in elevation of the structure of FIG. 10e, also showing the framing member in operative location with this board holder;

FIGS. 11a through 11d are views of portions of the alternate offset edge locator half circle indexing type board holder similar to the regular or non-offset type holder of FIGS. 9a and 9b;

FIG. 11a shows a part of the body portion in plan;

FIG. 11b shows a left-hand view of the body portion of the holder of FIG. 11a;

FIG. 11c is a right-hand view of the structure of FIG. 11a;

FIG. 11d is an elevational view of the structure of FIG. 11a;

FIG. 12a is a view in plan of a corner structure for the frame of FIG. 3a;

FIG. 12b is a view in side elevation of the structure of FIG. 12a;

FIG. 12c is a view in end elevation of the structure of FIG. 12a;

FIG. 13a is a view in plan of a slidable connector for the adjustable positionable framing members of FIG. 3a;

FIG. 13b is a view in side elevation of the structure of FIG. 13a;

FIG. 13c is a view in end elevation of the structure of FIG. 13a;

FIG. 14a is a plan view of one of the framing members of FIG. 3a;

FIG. 14b is a view of the structure of FIG. 14a in elevation;

FIG. 15a is a view in plan of the adjustably positionable framing members;

FIG. 15b is a view in side elevation of the structure of FIG. 15a;

FIG. 16a is a view in plan of the locking means for locking the board holders to the frame;

FIG. 16b is a view in side elevation of the structure of FIG. 16a; and

FIG. 16c is a view in front elevation of the structure of FIG. 16a including the screw therefor.

Referring now to FIG. 1, a brief description of the prior art will be presented as a background for enumerating the advantages of the present invention thereover. An X-Y table 21 is adapted for programmed movement under insertion head 23 in order that each of the five circuit boards 24 through 28 may be presented incrementally to head 23 for insertion of components from the component dispensers 31 under control of the electronics control panel 33. A tooling plate or work board holder 41 receives the circuit boards 24 through 28 beneath clamp hold down, such as 43 and 45. It may be seen that each circuit board, such as board 24, conforms to its circuit board window, such as window 47 and to associated indexing structure, as by holes and pins 49 and 51, the tooling plate 41 being indexed to the machine frame 51 by the indexing pins and holes 53 and 55. Slide rod 57 is provided for movement of X-Y Table 21 in the X axis direction. Movement in the Y direction is of course orthogonal to slide rod 57.

It may be seen from the foregoing that each work piece or circuit board 24 through 28 must conform to the windows, such as 47, and to the indexing pins and holes therefore, such as 49 and 51. There is no provision for universal holding of different sized circuit boards or for indexing to different indexing indicias such as half holes, slots and variously located holes; also, there is no provision for loading and unloading during operation, i.e. no continuous operation, but the arrangement must go to off-load position for applying five more boards to the tooling plate 41. Consequently, the cost of the tooling plate for each board type runs to $1200 or $1500. The prior art type devices may require a library of $30,000 worth of tooling plates for routine running of a single line in a single factory.

Additionally, it will be seen that the prior art does not provide for the rotation of the circuit boards or work pieces 24 through 28 by 90° to permit both column and row insertion of components.

Figure 1:
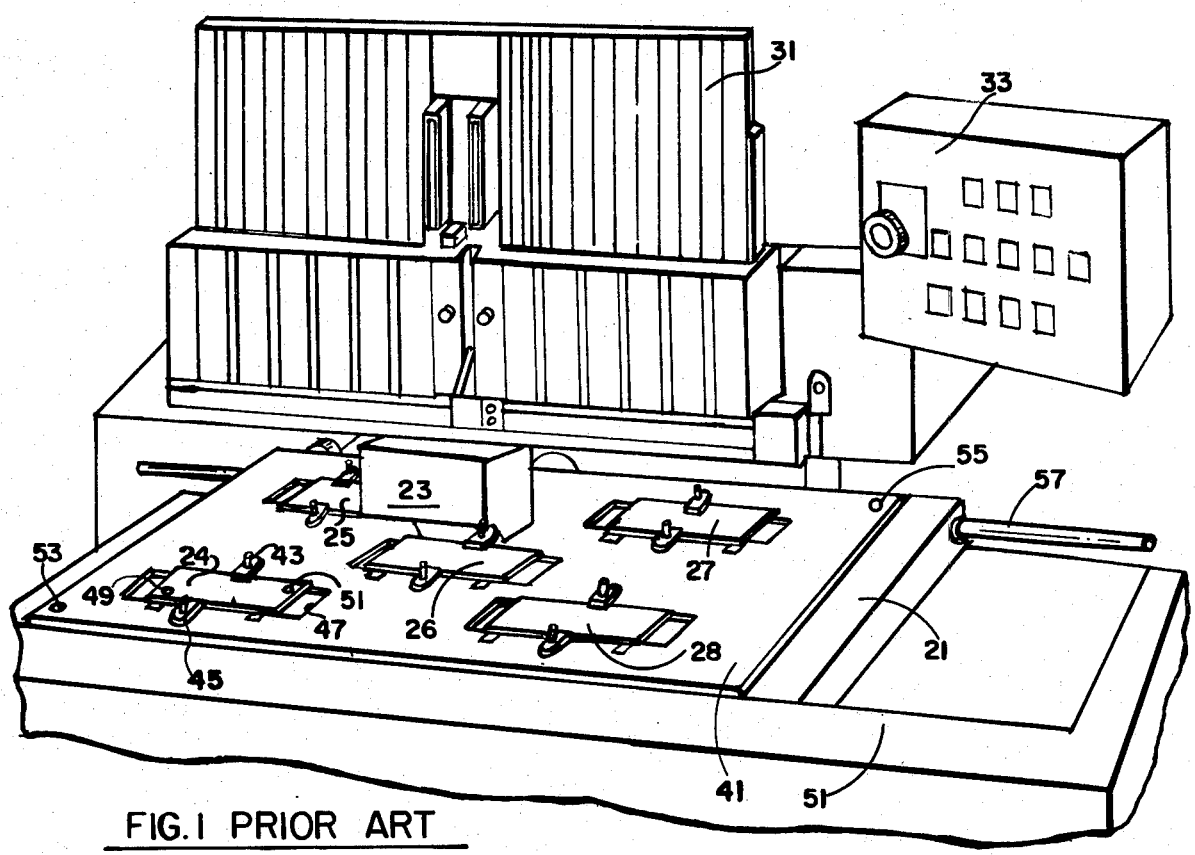
FIG. 1 is a perspective view of a typical prior art arrangement.
Figure 2:
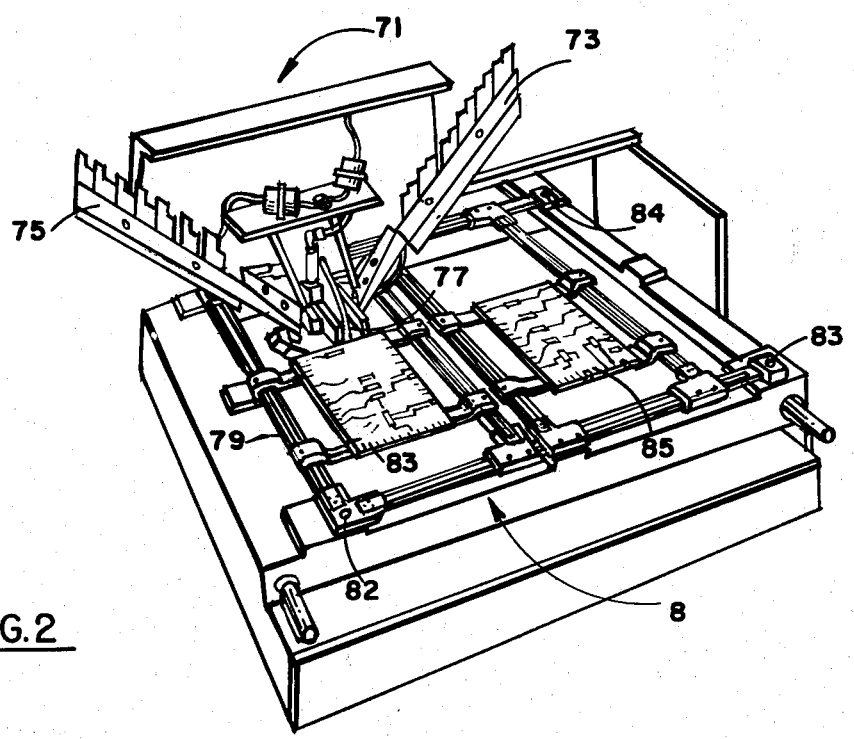
FIG. 2 is a view in perspective of the present invention applied to an automatic component insertion machine.

In FIG. 2, a perspective view of the present work holding system, applied to a component inserting machine, is shown which provides the advantages heretofore mentioned in the form of light-weight, precision, interchangeable framing and components adaptable to all types of insertion machines. The invention is shown applied to a dual-in-line inserter of the Amistar type 71, having component feeding tracts 73 and 75 extending to insertion head 77. The work holding system and apparatus is generally illustrated at 79 in FIG. 2. It is indexed to an X-Y table 81 by the indexing pins and holes 82 through 84. The work holding system 79 is shown accommodating a pair of circuit boards 83 and 85, and is better visible in the detailed view of FIGS. 3a, 3b and 3c wherein different boards are illustrated in operative position therewith.

Referring now to FIG. 3a, it may be seen that a substantially U-shaped frame for the work holding system 79 is comprised of opposed framing members 101 and 102 connected to a base member 103 to form the U-shaped with an open mouth to the right. Slidably mounted on the opposed framing members 101 and 102 is an adjustably positionable framing member 104. Framing members 103 and 104 are adapted to locate one or more circuit boards therebetween.

While the frame may comprise simply these three members, and along with the other components to be described, represents a first embodiment of the invention; nevertheless, the preferred embodiment includes the further adjustably positionable framing members 105 and 106, also slidable along the opposed framing members 101 and 102 to accommodate further boards and to offer the feature of 90° rotation, as will be explained. Also available from the preferred embodiment is the feature of loading on one side and unloading on the other side while maintaining continuous operation.

The U-shaped frame for the system 79 is rigidly made, and accordingly, the left-hand upper corner 111 and the lower-hand corner 113 are carefully machined from carbon steel. A detailed drawing is found in FIGS. 12a through 12c, wherein the corner piece 111 is shown cut-out to provide channels 115 and 117 for receiving respectively the upper opposed framing member 102 and the base framing member 103.

FIG. 14a shows framing member 102 provided with laterally spaced apart holes 121 and to conform with the holes 121' and 123' in corner piece 111 of FIG. 12a. These holes accommodate dowels 125 and 126 (FIG. 3a) which are force fitted therethrough to join the member 102 to corner piece 111. Also, threaded openings 129 of member 102 (FIG. 14a) and 131 of corner 111 (FIG. 12a) conform to receive the threaded screw 133 (FIG. 3a).

The large circular opening in framing member 102, shown at 137 (FIG. 14a), and in corner piece 111 in FIG. 12a at 138 are provided to receive the hardened bushing 139 (FIG. 3a) to provide for the indexing hole and pins, such as 82, shown in the lower left-hand corner piece 113 of FIG. 3a. Member 101 is joined to member 103 by corner piece 113 in the manner just described.

FIGS. 15a and 15b show the vertical framing member 103 having a recessed portion 145 for overlying corner piece 111. In FIG. 15a, holes 151 and 152 conform to holes 153 and 154 in cornerpiece 111 in FIG. 12a, and, also threaded holes 155 and 156 similarly conform so that the dowels 161 and 162 (FIG. 3a) may be force fitted through holes 151-153, and 152-154. Also, the screw 163 (FIG. 3a) is threaded through corresponding holes 155 and 156.

Sliders 171 (FIG. 3a) and 173 connect adjustably positionable framing member 104 to opposed framing members 101 and 102. Similarly, sliders 174 and 175 connect adjustably positionable framing member 105 to the framing members 102 and 101, and sliders 176 and 177 slidably affix the adjustably positionable framing member 106 to the framing members 102 and 101.

A further universal feature of the present invention resides in the fact that all framing members 101, 102, 103, 104, 105 and 106 have the same cross sectional configuration as is best illustrated in FIGS. 10e and 10f by the framing member 105. Similarly, all board holders, such as the offset releasable pressure type holder 201 of FIGS. 10e and 10f are internally channeled to receive this unique configuration common thereto.

While the principal portion of slider 175 of FIG. 3a is pictured in greater detail in FIGS. 13a-13c, its internal configuration will be described in connection with FIG. 3d taken along the plane 3d—3d of FIG. 3a. Slider 175 includes a main body portion 203 and a right-hand body portion 211 which is connected to the body portion 203 by the screws 213 (FIG. 3a) and 215. Thus, slider 175 defines a depending flange 211, and body portion 203 defines a depending flange 203'.

The left-hand edge of rail 101 is relieved at 215 and the body portion 203 includes a shoulder portion at 217, such that this edge of the depending flange 203' and corresponding edge of the framing member 101 form a complementary configuration.

The opposite edge of framing member 101 includes depending straight portion 219 (FIG. 3a) and a beveled portion 221. These two portions of the edge of framing member 101 are adapted to be gripped by the locking means which comprises a half nut 225, best seen in FIGS. 16a through 16c. A semicircular hole 229 (FIG. 13d inset) is drilled through the body portion 211 to accommodate the half nut 225 (FIG. 16c). A semicircular recess 231 (FIG. 13a) partially penetrates body portion 203 to provide a stop for the bottom of screw 233 (FIG. 16c). The internal portion of half nut 225 (FIG. 16c) is bored at 235 and internally threaded at 237. The lower portion 241 of half nut 225 is dove-tailed, as is best seen in FIGS. 3d and 16b. Accordingly, when screw 233 is turned downwardly against the stop in body 231, only half-nut 225 can move. Consequently, it is raised to engage its dove-tailed surface 241 (FIG. 3d) with the beveled surface 221 of framing member 101 to tighten the framing member on its opposite side against the interior configuration of body portion 203 with shoulder 217 being abutted by recessed portion 215 to lock the slider 175 against the rail formed by framing member 101. Slide 171 includes two locking arrangements 251 and 252 (FIG. 3a) of the type just described.

In FIG. 13a, body portion 203 of slider 175 is shown in plan with an end view being shown in FIG. 13c and a side view in FIG. 13b. It may be seen that the semicircular openings 262 and 231 do not penetrate body portion 203, but rather form the stops for the screws, such as 233 of FIG. 16c in order that turning the screws will raise the half nuts, such as 225.

Also, in FIG. 13c, it may be seen that body portion 203 includes pin receiving holes 264, 265, 266, and 267 provided for pins (not shown) to secure depending body portion 211 (FIG. 3a) to main body portion 203.

Slider 175 is connected to framing member 105 by way of the dowel accommodating holes 271, 272 and the screw accommodating threaded hole 273. The dowels 274 and 275 and the screw 276 are visible in FIG. 3a.

The other sliders are connected to their respective framing members in the same manner, the only difference being that some sliders, such as 171 are left-handed rather than right-handed as is 175.

All sliders carry indexing means for use with the scales along which they slide. FIGS. 13a, 13b, and 13c show body shoulder 277 with inclined face 278 carrying indicia 279 for registration with scale 301 of FIG. 3a.

Returning to FIG. 3a, it may be seen that each of the framing members carries a linear scale. These scales are numbered correspondingly to the framing member, such as framing member 101 carries scale 301, framing member 102 carries scale 302, etc. through scale 306 on framing member 106. All of these scales are interrelated or referenced together to a programmed home position or datum. Looking at the lower left-hand corner of FIG. 3a, the indexing pin 82 has a center point from which the edge of scale 303 is offset by 2". Similarly, the edge of scale 301 is offset orthogonally therefrom by 2" from the center point of index pin 82. The opposite corner of the square formed by these offsets from the center point of pin 82 is a point 307 which may be considered as the programmed home position or datum point.

FIGS. 4a through 11d picture a plurality of board holders of different types. There are five pairs of regular or non-offset types of holders and two pairs of offset type holders for a total of 14 holders. Each pair includes a right-hand holder and a left-hand holder, or simply differently oriented holders for universal accommodation of the board edges, indexing slots, holes and half-holes; and the orthogonal positioning of the same or different boards.

Figure 4A:
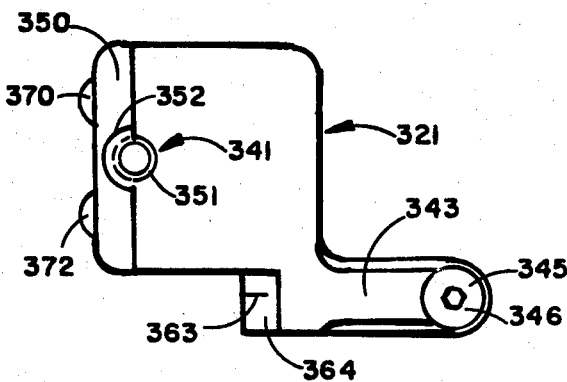
FIG. 4a is a view in plan of an edge locator board holder for indexing to a cut out of a circuit board.
Figure 4B:
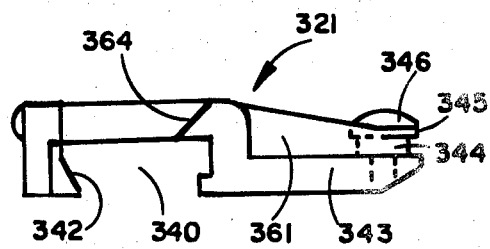

In FIGS. 4a and 4b, there are shown details of the edge locator type holder 321 adapted for fitting cutout indexing indentations or slots in the edges of circuit boards. In FIG. 3a, registration edge 331 of circuit board 325 includes a cutout 327 and a half-hole 329 (see inset). The edge locator cutout or slot indexing type holder 321 of FIG. 4a is adapted to register with the edge cutout or slot 327 of FIG. 3a to provide a second point along an indexing line wherein the accurate indexing is accomplished through the much smaller half-hole 329 in registration with the edge locator type holder 335 of FIGS. 5a and 5b which is adapted to fit the half circle 329 precisely. Registration edge 331 is precisely aligned by these two points. FIG. 3a pictures the other holder 335' of the pair of edge half-hole indexing holders 335 (FIG. 5a) and 335' (FIG. 3a).

The holder 321 of FIGS. 4a and 4b may be machined from aluminum and includes the channel 340 (FIG. 4b) with the locking means 341 including the dove tail 342 for gripping one of the framing members. Arm 343 includes the indexing cylindrical locator 344 with upper collar or shoulder 345. The cylindrical locator 344 is fastened to the arm 343 by means of a hex screw 346.

The left-hand portion of the body of holder 321 is shown at 350. The reason that this is a separate portion of the body is because of the requirements for machining the hole 351 for receiving the half nut 352 which includes the wedging dove tail 342. Holder 321 includes a reinforcing rib 361 and an indexing indicia 363 carried by a beveled portion 364 of the body of holder 321. Indicia 363 is on the center line of cylindrical locator 344. While this particular holder is not intended to function as an exact indexing means, nevertheless the indicia 363 serves to roughly approximate the position of holder 321 for receiving a circuit board. The left-hand body portion 350 is affixed to the rest of the body of holder 321 by means of the screws 370 and 372.

The indexing cylindrical locator 344 indexes to the type slot 371 of boards 399 of FIG. 3c or slot 327 of board 325 in FIG. 3a. The holder 321' of FIG. 3c is an offset version of the holder 321 of FIG. 4a. Board 399 of FIG. 3c is shown with its registration edge extending to the right and left, such that offset holder 321' engages slot 371 from the bottom of board 399. The regular (non-offset) holder 321 is provided to engage a board having its registration edge extending orthogonally to that of board 399. Hence, in FIG. 3a, holder 321 is shown extending to the right of framing member 103 to receive a board which would be oriented with its registration edge extending up and down the drawing sheet.

Figure 5A:
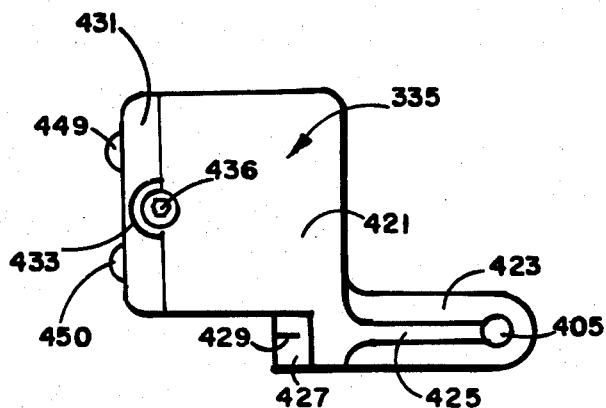
FIG. 5a is a view in plan of an edge locator type board holder capable of indexing to a half circle edge cutout of a circuit board.
Figure 5B:
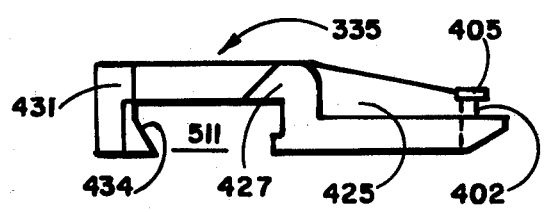

The accurate or non-offset indexing holder 335 of FIGS. 5a and 5b is also pictured in the offset version at 335' in FIG. 3c. The holder 335' indexes to the half hole 401 (FIG. 3c) by means of pin 402' (see inset) also shown in the offset version of FIGS. 9a and 9b. Returning to the regular holder 335 of FIGS. 5a and 5b, pin 402 includes a head 405 to prevent the circuit board 325 (FIG. 3a) from being lifted out of the holder. Also, pin 402 is contiguous with reinforcing rib 425 in arm 423 which extends rearwardly to the indexing beveled portion 427 carrying the indexing mark 429. The indicia 429 is the most accurate indicia of the holders because pin 402 snugly fits indexing half circle 401 to provide the principal indexing between circuit board 325 and the component inserting machine.

The body 421 of holder 335 includes a left-hand portion 431, also because of the requirements of machining a half hole for the half-nut 433 which includes the lower bevelled portion 434 and is affixed to the body portion of the half-nut 436. Screws 449 and 450 hold the left-hand portion 431 to the main body portion 421. Also, locating pins are included but are invisible in this particular view.

Figure 9A:
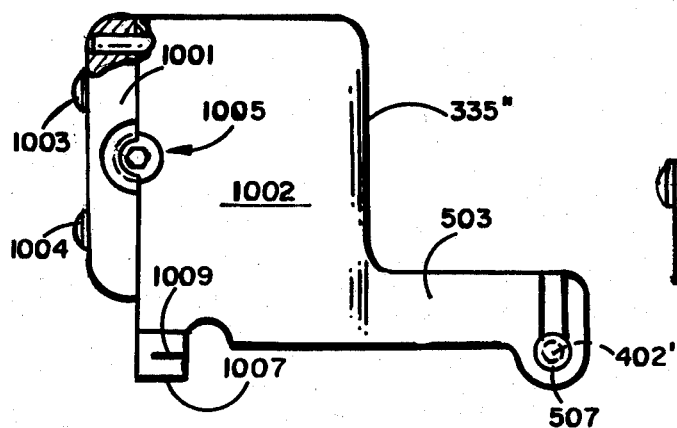
FIG. 9a is a view in plan of an alternate or 90° offset type board holder relative to the board holder of FIG. 5a, capable of indexing to a half circle in the edge of a board when oriented at 90° for orthogonal component insertion.
Figure 9B:
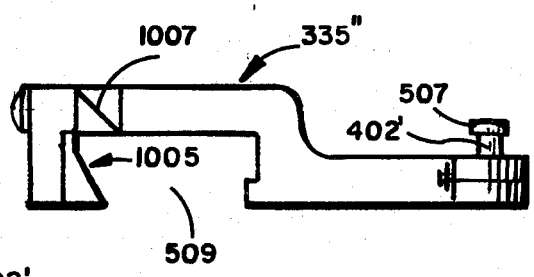

The offset version 335' of holder 335 is pictured in FIGS. 9a and 9b. The arm 503 carries the indexing pin 402' with head 507. The channel 509 is provided for gripping one of the channel members 301–306 in the manner of channel 511 of the non-offset holder 335 of FIG. 5b.

FIG. 3c shows an offset indexing holder 335' carried by framing member 106 in indexed relation with circuit board 399. Holder 335' functions in the same manner as holder 335, but permits orthogonal rotation of a board while providing indexing thereto.

Figure 6A:
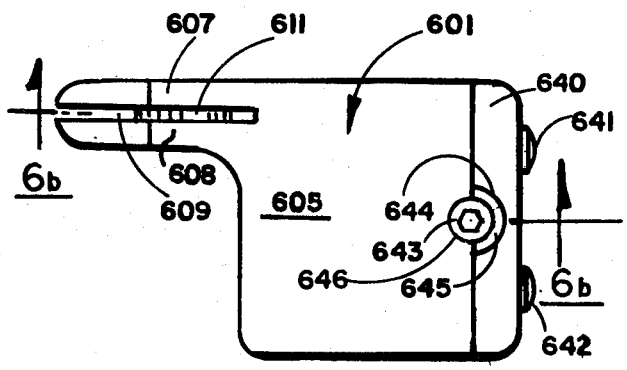
FIG. 6a is a view in plan of a hold down type board holder capable of quick pressure release of circuit boards.
Figure 6B:
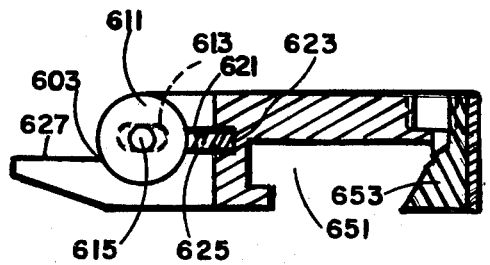

FIGS. 6a and 6b show a wheel-type holder 601 adapted to receive a card in a nip 603 and exert a resilient pressure thereon to hold it in place. A major body portion 605 includes an extension 607 and 608 which is bifurcated by the slot 609. The body portion 605 includes an elongated slot 613 (FIG. 6b). The wheel 611 includes a hole passing through the center thereof to receive press fit pin 615 which is supported by the sides 607 and 608 of the bifurcated slot 609. A spring 621 is contained between the rear wall 623 of a chamber 625 formed in the body portion 605 and the rear edge of wheel 611. The spring 621 normally biases wheel 611 forwardly so that pin 615 is against the rear of slot 613. When the circuit board is laid on the extension platform 627 and forced into nip 603, the wheel 611 moves rearwardly (to the right in FIG. 6b) and accommodates an edge of the board beneath its forward periphery in order to grip and retain the board against movement.

The remainder of the wheel-type holder 601 is the same as previously explained in connection with the holders, i.e. having a right-hand body portion 640 with screws 641 and 642 connecting it to the main body portion 605 to facilitate drilling of the locking attachment semihole 644, into which half-nut 645 fits. Semirecess 646 receives part of screw 643 and provides a bottom stop therefor. Also, the holder 601 includes the channel 651 for receiving a rail or framing member and the dove tail wedge 653 for locking the holder to the framing member.

In FIG. 3a, the wheel-type holder 601 is shown in engagement with board 325, along with its counterpart wheel-type holder 602 shown above it. These holders are moveable and may grip the board 325 at any location. They do not require indexing indicia for this reason.

The offset versions of the wheel-type holders are shown at 701 and 702 in FIG. 3c, and holder 701 is detailed in FIGS. 10e and 10f. It may readily be appreciated that the offset configuration permits the wheel-type holder 701 and 702 to engage the board 399 (FIG. 3c) when it is oriented at a 90° angle to the board 325 (FIG. 3a) which is engaged by the regular or non-offset wheel-type holders 601 and 602.

Considering now FIGS. 10a through 10f, it will be seen that the offset wheel-type holder 701 includes a main body portion 703 (FIG. 10a). An arm 705 extends outwardly to form the housing 707 having the forwardly extending platform 708, both being bifurcated by the slot 709. It may be seen that the elongated slot 710 penetrates the housing 707 to carry the pin that supports the wheel.

At the left side of body portion 703 is the half recess 731, better seen in the left-hand view of FIG. 10d of the body portion 703. The two screw holes 712 (FIG. 10d) are visible at the outer boundaries of body portion 703 with the two pin receiving holes 713 being visible inboard thereof. In FIG. 10c, the cylindrical chamber 714 is visible at the rear end of the slot 709. Also, a portion of the channel 716, for receiving a framing member, such as 105, is shown in FIG. 10c).

In FIGS. 10e and 10f there is shown a detailed view of the releasable wheel-type holder 701, in position mounted on framing member 105. It may be seen that the left-hand body portion 711 is joined to the main body portion 703 by the screws 713' and 715', along with the pins. Half nut 725 is disposed in semicircular hole 729 with screw 733 being in threaded recess 731. The left-hand body portion 711 depends as flange 711' to cause the holder 701 to grip the track or framing member 105.

From FIG. 10f, it may be seen that the right-hand edge of framing member 105 is relieved at 715 and the body portion 703 includes a shoulder portion 717 such that this edge of the depending flange 703', and corresponding edge of the framing member 105 form a complementary configuration. The opposite edge of framing member 105 includes depending straight portion 719 and the beveled portion 721. These two portions of the edge of framing member 105 are adapted to be gripped by the locking means comprising the half-nut 725. The dove tailed surface 741 is the lower portion of half-nut 725 and when screw 733 (FIG. 10e) is turned downwardly against the stop (bottom of recess) embodied in body 703, only half nut 725 is free to move. Consequently, it is raised to engage dove-tailed surface 741 with the beveled surface 721 of framing member 105 to tighten the framing member on its opposite side against the interior configuration of body portion 703 with shoulder 717 being abutted by recessed portion 715 to lock the holder 701 against the rail formed by framing member 105.

The releasable wheel arrangement is provided by the wheel 706 carried in housing 707 supported by arm 705, with the wheel biased forwardly by the spring contained in chamber 714 (FIG. 10f).

Figure 7A:
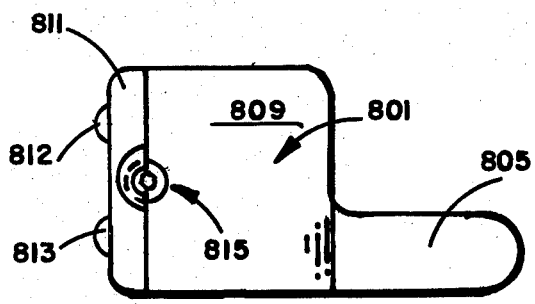
FIG. 7a is a view in plan of a board holder of the board arm rest or cantilever type.
Figure 7B:
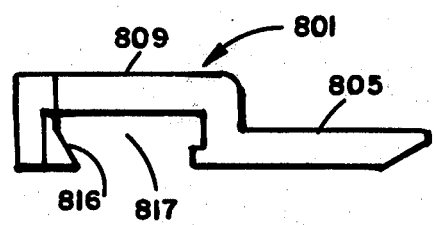

In FIGS. 7a and 7b, there is shown a further type holder, namely an arm rest type holder 801. In FIG. 3a, the arm rest holder 801 is shown in position on rail 105, and its counterpart holder 802 is shown in position on rail 106, both supporting the circuit board 804 with the latter merely resting on the extensions 805 and 806 of the respective holders. Obviously, the arm-rest holders provide no indexing and they are only useful in connection with other holders that take over the indexing function. However, they offer the advantages of location any where without regard to the indicia holes or slots and they provide ready removal for quick change when it is desired to switch circuit boards while the inserter is operating on a different board located by the universal holding system of the present invention.

In FIG. 7a, the holder 801 includes a main body portion 809 and a left-hand body portion 811 secured thereto by the screws 812 and 813. Again, the locking mechanism is the same as heretofore explained and is shown generally at 815. The dove tail 816 provides the wedging action in the channel 817 to connect holder 801 to one of the framing members. Also, in FIG. 7b it may be seen that the arm 805 is recessed downwardly to the height of the other platforms or arms in order that the boards may be held level.

Figure 8A:
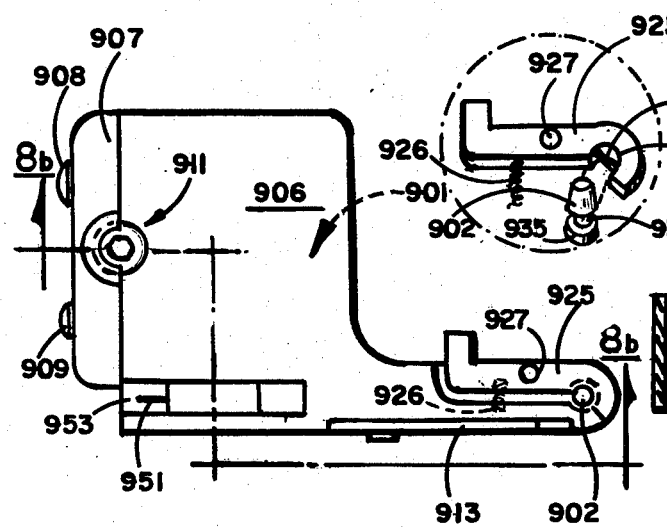
FIG. 8a is a view in plan of a pin location type board holder capable of interchangeable pin types for accommodating various sized holes in circuit boards.
Figure 8B:
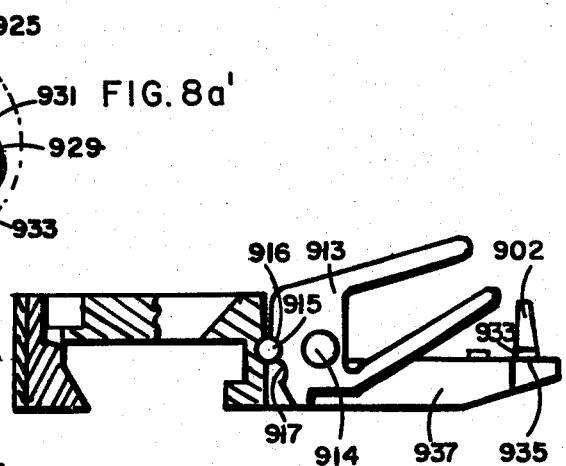

In FIGS. 8a and 8b, there is shown a pin type holder 901 having a pin 902 which fits holes in the cards for indexing. Actually the pin 902 is interchangeable with pins of different sizes in order that various size holes may be accommodated in the cards while maintaining the indexing function. Since this particular holder is accurate in indexing, it may be employed with the non-indexing type arm-rest holders 801 and 802, as shown in FIG. 3a where the pin holders 901 and 903 index to holes in the card or board 804 adapted to fit the size of pin 902. The fit between the pin 902 and its corresponding hole is snug to provide the indexing which is also the case with its counterpart pin 902' of holder 903.

Returning now to detailed FIGS. 8a and 8b, it will be seen that the same general type structure is provided for holder 901 in that a body portion 906 has connected thereto a left hand and body portion 907 by means of the screws 908 and 909. The locking mechanism 911 is the same as heretofore explained. However, the difference between this holder 901 and the others is twofold. Namely, it has a detent mechanism in the form of a fork 913, pivotally mounted on pin 914 for movement against a detent pin 915. The fork 913 is shown in its upper position with its upper indentation 916 in engagement with detent 915. It also has a lower indentation 917 which receives pin 915 when the fork is pivoted downwardly to hold a board in position on pin 902.

The releasable pin type holder 901 includes a latching mechanism for accommodating the quick interchange of different size pins, such as pin 902 of FIG. 8b, to facilitate the accommodation of different size diameter indexing holes. This mechanism includes a release lever 925 (FIG. 8a) pivotally mounted on pin 927. Lever 925 includes an open mouth region 929 (see inset) which has a blade 931 partially disposed centrally across this opening. The purpose of blade 931 is to seat within the groove 933 of pin 902 and retain it in place with the lower shoulder 935 fitting within a recess in the platform arm 937 of holder 901. Pin shoulder 935 is fitted into the recess in holder arm 937 and the release lever or handle 925 is journalled on pin 927. The handle is retained in position by spring 926 (see FIG. 8a).

Indexing is achieved by using indicia 951, carried by inclined plane 953, for aligning pin 902 with dimensional positions on the scales carried by the framing members. Mark 951 is on the center line of pin 902, as extended.

In FIGS. 9a and 9b the offset version of the edge type holder 335" for fitting a half hole using pin 402' to index has been briefly discussed. It comprises the same type structure heretofore explained in that the left-hand body portion 1001 is affixed to the main body portion 1002 by means of the screws 1003 and 1004. A locking mechanism 1005, of the type heretofore described, is incorporated in this holder, also. It is capable of accurate indexing due to the inclined body shoulder plane 1007 carrying the indexing or scribed line 1009.

FIGS. 11a through 11d reveal further details of the structure of the offset type holder 335". The main body 1002 is pictured in plan in FIG. 11a and includes the arm 503 and the pin 402'. The indexing mark on inclined plane 1007 has not been applied, as of the present stage of manufacture.

From the left-hand view of main body part 1002, it may be seen that threaded openings are provided at 1003' and 1004' for the respective screws 1003 and 1004. Also, pinholes 1015 and 1016 are provided for alignment pins. The recess for the screw of the locking means is shown at 1017 in both views.

The right-hand view shows the lower platform or extension arm 1021 for receiving the board.

FIG. 11d shows the reinforcing web 1025 behind pin 402', the inclined plane 1007, the arm 503 and main body portion 1002.

Each of the plurality of holders has now been described and each has been illustrated in one or more figures of the present drawing. They may be found as follows:

The standard edge slot type 321 (FIG. 4a), and its associated holder 335 to comprise the pair shown in FIG. 3a;

The half-hole edge type holder 335, (FIG. 5a), and its mate 335', shown in FIG. 3a;

The offset half-hole indexing holders 335" (FIG. 9a and in FIG. 3c), and its complementary holder 335''' shown in FIG. 3a;

The releasable wheel hold-down type holder 601 of FIG. 6a and its counterpart 602 of FIG. 3a;

The offset releasable wheel type 701 of FIG. 10e and its mate 702 of FIG. 3c;

The arm-rest type holder 801 of FIG. 7a and its mate 801' of FIG. 3a; and, The interchangeable pin type holder 901 of FIG. 8a and its complementary holder 903 of FIG. 3a.

It should be understood that there is a choice of materials and methods of manufacture for the holders and sliders as they may not only be machined, but also cast from iron, aluminum or other suitable materials. Thus, any modifications to the systems noted above are intended to be included in the description. The description is intended to be illustrative only and not limitative. The scope of the invention is limited only by the claims appended hereto.

What is claimed is:

1. A work holding system for adjustably holding printed circuit boards for automatic machine component insertion comprising, in combination:
   a U-shaped frame having opposed framing members connected by a base framing member to leave an open mouth between the opposed framing members opposite to the base framing member;
   an adjustably positionable framing member entending between, and slidable along, the opposed framing members toward and away from said base framing member;
   means for locking the adjustably positionable member to the frame;
   linear scales carried by each of said members with said scales having a common datum;
   indexing means carried by said frame to index it to said machine for inserting components;
   a plurality of adjustable board holders slidably carried by the base framing member and the adjustably positionable framing member;
   means for locking said board holders to their respective framing members in positions to receive said circuit boards for attaching same to said frame; and,
   indexing means carried by at least one of said receiving board holders for indexing said boards for component insertion by said machines.

2. The work holding system of claim 1, further comprising:
   a second pair of adjustably positionable framing members extending between and slidable along the opposed framing members between said first mentioned adjustably positionable framing member and said mouth of the frame;
   means for locking each of said pair to the frame;
   linear scales carried by each of said pair, with said scales being referenced to said common datum;
   a plurality of adjustable board holders slidably carried by said pair;
   means for locking said board holders to said pair in positions to receive further circuit boards for attaching same to said frame; and,
   indexing means carried by at least one of said last mentioned receiving board holders for indexing said further boards for component insertion by said machine.

3. The work holding system of claim 2, wherein:
   said framing members comprise a body having substantially parallel top and bottom surfaces and differently configured opposed sides;
   one of said sides being bevelled inwardly adjacent the bottom surface, and the other of said sides being recessed;
   said board holders including a framing member receiving channel formed by depending flanges;
   one of said flanges including a shoulder portion to conform to the other of said sides;
   the other of said flanges including a semi-circular opening;
   said locking means for the board holders comprising a semi-circular half-nut having an inwardly extending dove-tail conforming to the bevel of said one of said sides of the framing members, and a half diameter to fit within said semi-circular opening;
   said half-nut being half bored and internally threaded along the bore; and
   a screw adapted to engage the internal threads;
   said body having a cavity and a shoulder opposite the semi-circular opening for receiving and retaining the screw while it engages said half-nut whereby turning the screw raises and lowers said half-nut to force the dove-tail against the bevelled side of the framing members to wedge the one flange of the board holder against the other side of the framing members.

4. The work holding system of claim 1, wherein:
   one of said plurality of board holders comprises an edge locator type having a body with channel for receiving a framing member and an arm extending outwardly from the body;
   a pin carried by said arm at a forward location therealong for indexing with a circuit board; and,
   said indexing means comprising a line indicia carried by the body adjacent a framing member scale, and wherein said line indicia is normal to said scale and on a line which passes through the center of said pin.

5. The work holding system of claim 4, further comprising:
   a head on top of said pin for retaining said circuit board against removal.

6. The work holding system of claim 1 wherein; another of said plurality of board holders comprises a second edge locator type having a body with channel for receiving a framing member and an arm extending outwardly from the body;
   a cylindrical locator fixed to said arm at a forward location therealong for indexing with a circuit board to comprise one indexing point along a registration edge indexing line.

7. The work holding system of claim 6 further comprising:
   a collar adjacent to the top of the cylindrical indexing locator for retaining said circuit board against removal.

8. The work holding system of claim 7, further comprising:
   general indexing means carried by said body;
   said indexing means comprising an engraved line indicia carried by the body adjacent to the framing member scale, and wherein said line indicia is normal to said scale and on a line which passes through the center line of said cylindrical locator.

9. The work holding system of claim 1 wherein;
   yet another of said plurality of board holders comprises an edge hold down type for applying releasable pressure to the board and having a body with channel for receiving a framing member and an arm extending outwardly from the body;

a housing carried by said arm at the forward end thereof;

a forwardly extending flange along the lower edge of the housing;

said housing and flange having a slot therein extending inwardly thereof;

a wheel disposed in said slot and having a central opening;

a pair of elongated openings in the housing on opposite sides of said slot;

an axle mounted in said elongated openings and press fit to said opening to said wheel; and a spring biasing said wheel in a direction forwardly of the housing to provide a nip between the wheel periphery and said forwardly extending flange whereby said circuit board is engaged in the nip with said wheel extending downwardly and outwardly exerting forces on the board to releasably maintain it in engagement between said yet another of the holders and with others of said board holders.

10. The work holding system of claim 1, wherein still another of said plurality of board holders comprises an arm rest supporting type holder having a body with a channel for receiving a framing member, and an arm extending outwardly from the body;

said arm having an upper surface at a level beneath the upper surface of the body for receiving a board; and releasable locking means to permit movement of the body along the framing member and locking of the body against movement when positioned.

11. The work holding system of claim 10 wherein a complementary arm rest type holder to said still another board holder comprises a body with a channel for receiving a framing member, and an arm extending outwardly from the body; said arm having an upper surface at a level beneath the upper surface of the body for receiving a board; the orientation of the arms of said still another arm rest holder and said complementary arm rest holder being opposite relative to their respective bodies whereby when said another arm rest holder is carried by said base framing member and said complementary arm rest holder is carried by said adjustably positionable framing member, said arms extend inwardly pointing toward one another; and, releasable locking means for locking said complementary arm rest to a framing member.

12. The work holder system of claim 1, wherein: sill a further of said plurality of board holders comprises a removable pin type holder having a body with a channel for receiving a framing member, and an arm extending outwardly from the body;

said arm having an opening near its extremity;

a pin having a shoulder snuggly fitted within said opening;

said pin having a grove above the arm level;

a release lever pivotally mounted on said arm for lateral pivotal movement relative thereto; and said lever having a blade adapted to fit said grove to lock the pin in position within the opening, while facilitating pin changes.

13. The removable pin holder of claim 12 further comprising:

a detent means for retaining a board on said pin;

a pin pivotally mounting the fork body to said arm;

said fork body having indentations therein;

a detent pin carried by the holder body for receiving a first indentation of the fork body to hold said tines elevated relative to said arm and for receiving a second indentation of the fork body to hold said tines in a lowered position to maintain a board on said pin; and, means for releasably locking the pin holder to a framing member.

14. The removable pin holder of claim 13 further comprising:

indexing indicia marked on the holder body in alinement with a center line through said pin and normal to a framing member engaged by the body channel.

15. The work holder system of claim 14 wherein:

a complementary holder to said removable pin type holder comprises identical structure except that the orientation of the arm of said complementary holder and the arm of said removable pin type holder are opposite relative to their respective bodies whereby when said pin type holder is carried by said base framing member and said complementary holder is carried by said adjustably positionable framing member, said arms extend inwardly pointing toward one another.

16. A work holding system for adjustably holding printed circuit boards for automatic machine component insertion comprising, in combination:

means having spaced apart framing members connected by a base framing member to leave an open mouth between the spaced apart framing members opposite to the base framing member;

at least one adjustably positionable framing member extending between, and slidable along, the spaced apart framing members toward and away from said base framing member;

means for locking the adjustably positionable member to the spaced apart framing members;

scales carried by each of said members with said scales having a common datum;

indexing means carried by said frame to index it to said machine for inserting components;

at least a pair of adjustable board holders slidably carried by the base framing member and the adjustably positionable framing member;

means for locking said board holders to their respective framing members in positions to receive said circuit boards for attaching same to said frame means; and, indexing means carried by at least one of said adjustable board holders for indexing said boards for component insertion by said machines.

17. The work holding system of claim 1, further comprising:

a second pair of adjustably positionable framing members extending between and slidable along the spaced apart framing members between said first mentioned adjustably positionable framing member and said mouth of the frame means;

means for locking each of said pair to the spaced apart framing members;

scales carried by each of said pair, with said scales being referenced to said common datum;

at least a pair of adjustable board holders slidably carried by said pair;

means for locking said board holders to said pair in positions to receive further circuit boards for attaching same to said frame means; and indexing means carried by at least one of said last mentioned receiving board holders for indexing said further boards for component insertion by said machine.

18. The work holding system of claim 17, wherein:

one of said plurality of board holders comprises an edge locator type having a body with channel for receiving a framing member and an arm extending outwardly from the body;

said arm having an extremity portion at right angles thereto;

a pin carried by said portion at a forward location therealong for indexing with a circuit board;

said indexing means comprising a line indicia carried by the body adjacent a framing member scale, and wherein said line indicia is normal to said scale and on a line which passes through the center of said pin; and means carried by the edge holder for releasably locking it to a framing member.

19. The work holding system of claim 18 further comprising:

a complementary holder for said edge locator type comprising identical structure thereto except that the orientation of the arm of said complementary holder and the arm of said edge locator holder are opposite relative to their respective bodies, whereby when said edge type holder is carried by said base framing member and said complementary holder is carried by said adjustably positionable framing member, said arms extend inwardly pointing toward one another.

20. The work holding system of claim 19 wherein:

yet another of said plurality of board holders comprises an edge hold down type for applying releasable pressure to the board and having a body with channel for receiving a framing member and an arm extending outwardly from the body;

said arm having an extremity portion at right angles thereto;

a housing carried by said extremity portion at the forward end thereof;

a forwardly extending flange along the lower edge of the housing;

said housing and flange having a slot therein extending inwardly thereof;

a wheel disposed in said slot and having an elongated central opening;

a pair of elongated openings in the housing on opposite sides of said slot;

an axle mounted in said elongated openings press fit to said opening to said wheel; and a spring biasing said wheel in a direction forwardly of the housing to provide a nip between the wheel periphery and said forwardly extending flange whereby said circuit board is engaged in the nip with said wheel extending downwardly and outwardly exerting forces on the board to releasably maintain it in engagement between said yet another of the holders and with others of said board holders; and means for releasably locking the edge holder to a framing member.

21. The work holder system of claim 20 further comprising:

a complementary holder to said edge holder comprising identical structure except that the orientation of the arm of said complementary holder and the arm of said edge type holder are opposite relative to their respective bodies whereby when said edge type holder is carried by said base framing member and said complementary holder is carried by said adjustably positionable framing member, said arms extend inwardly pointing toward one another.

22. The work holding system of claim 17, wherein:

said framing members comprise a body having substantially parallel top and bottom surfaces and differently configured opposed sides;

one of said sides being bevelled inwardly adjacent the bottom surface, and the other of said sides being recessed;

said board holders including a framing member receiving channel formed by depending flanges;

one of said flanges including a shoulder portion to conform to the other of said sides;

the other of said flanges including a semi-circular opening;

said locking means for the board holders comprising a semi-circular half-nut having an inwardly extending dove-tail conforming to the bevel of said one of said sides of the framing members, and a half diameter to fit within said semi-circular opening;

said half-nut being half bored and internally threaded along the bore;

a screw adapted to engage the internal threads; and said body having a cavity and a shoulder opposite the semi-circular opening for receiving and retaining the screw while it engages aid half-nut whereby turning the screw raises and lowers said half nut to force the dove tail against the bevelled side of the framing members to wedge the one flange of the board holder against the other side of the framing members.

23. The work holding system of claim 22, wherein:

one of said plurality of board holders comprises an edge locator type having a body with channel for receiving a framing member and an arm extending outwardly from the body;

a pin carried by said arm at a forward location therealong for indexing with a circuit board; and said indexing means comprising a line indicia carried by the body adjacent a framing member scale, and wherein said line indicia is normal to said scale and on a line which passes through the center of said pin.

24. The work holding system of claim 22 wherein another of said plurality of board holders comprises a second edge locator type having a body with channel for receiving a framing member and an arm extending outwardly from the body; and, a cylindrical locator fixed to said arm at a forward location therealong for indexing with a circuit board to comprise one indexing point along a registration edge indexing line.

25. The work holding system of claim 22 wherein:

yet another of said plurality of board holders comprises an edge hold-down type for applying releasable pressure to the board and having a body with channel for receiving a framing member and an arm extending outwardly from the body;

a housing carried by said arm at the forward end thereof;

a forwardly extending flange along the lower edge of the housing;

said housing and flange having a slot therein extending inwardly thereof;

a wheel disposed in said slot and having a central opening;

a pair of elongated openings in the housing on opposite sides of said slot;

an axle mounted in said openings and penetrating the opening to said wheel; and a spring biasing said wheel in a direction forwardly of the housing to provide a nip between the wheel periphery and said forwardly extending flange whereby said circuit board is engaged in the nip with said wheel extending donwardly, and outwardly exerting forces on the board to releasably maintain it in engagement between said yet another of the holders and with others of said board holders.

26. The work holder system of claim 22, wherein still a further of said plurality of board holders comprises a removable pin type holder having a body with a channel for receiving a framing member, and an arm extending outwardly from the body;

said arm having an opening near its extremity;

a pin having a shoulder snuggly fitted within said opening;

said pin having a grove above the arm level;

a release lever pivotally mounted on said arm for lateral pivotal movement relative thereto; and said lever having a blade adapted to fit said grove to lock the pin in position within the opening, while facilitating pin changes.

* * * * *